United States Patent [19]
Jones, Jr. et al.

[11] Patent Number: 5,583,068
[45] Date of Patent: Dec. 10, 1996

[54] PROCESS FOR FORMING A CAPACITOR HAVING A METAL-OXIDE DIELECTRIC

[75] Inventors: Robert E. Jones, Jr.; Papu D. Maniar; Andrew C. Campbell; Reza Moazzami, all of Austin, Tex.

[73] Assignee: Motorola, Inc., Schaumburg, Ill.

[21] Appl. No.: 430,680

[22] Filed: Apr. 28, 1995

Related U.S. Application Data

[62] Division of Ser. No. 100,793, Aug. 2, 1993, Pat. No. 5,439,840.

[51] Int. Cl.$^6$ .......................... H01L 21/70; H01L 27/00
[52] U.S. Cl. .................. 437/52; 437/60; 437/919
[58] Field of Search ................. 437/47, 48, 52, 437/60, 919; 257/295, 308, 310; 365/145

[56] References Cited

U.S. PATENT DOCUMENTS

| | | | |
|---|---|---|---|
| 4,251,326 | 2/1981 | Arcidiacono et al. | 204/15 |
| 4,952,904 | 8/1990 | Johnson et al. | 338/36 |
| 4,985,718 | 1/1991 | Ishijima | 357/23.6 |
| 5,005,102 | 4/1991 | Larson | 361/313 |
| 5,046,043 | 9/1991 | Miller et al. | 365/145 |
| 5,109,357 | 4/1992 | Eaton, Jr. | 365/145 |
| 5,142,437 | 8/1992 | Kammerdiner et al. | 361/313 |
| 5,142,438 | 8/1992 | Reinberg et al. | 361/313 |
| 5,146,299 | 9/1992 | Lampe et al. | 357/23.5 |
| 5,155,573 | 10/1992 | Abe et al. | 357/51 |
| 5,164,808 | 11/1992 | Evans, Jr. et al. | 361/305 |
| 5,185,689 | 2/1993 | Maniar | 361/313 |
| 5,191,510 | 3/1993 | Huffman | 361/313 |
| 5,196,909 | 3/1993 | Chan et al. | 257/296 |
| 5,254,217 | 10/1993 | Maniar et al. | 156/656 |
| 5,257,238 | 10/1993 | Lee et al. | 365/230.06 |
| 5,258,093 | 11/1993 | Maniar | 156/626 |
| 5,283,462 | 2/1994 | Stengel | 257/595 |
| 5,300,799 | 4/1994 | Nakamura et al. | 257/295 |
| 5,313,089 | 5/1994 | Jones, Jr. | 257/295 |
| 5,329,486 | 7/1994 | Lage | 365/145 |
| 5,350,705 | 9/1994 | Brassington et al. | 257/295 |
| 5,381,302 | 1/1995 | Sandhu et al. | 361/305 |
| 5,426,561 | 6/1995 | Yen et al. | 361/502 |

FOREIGN PATENT DOCUMENTS

| | | | |
|---|---|---|---|
| 0396221A2 | 11/1990 | European Pat. Off. | G11C 11/22 |
| 0430404A1 | 6/1991 | European Pat. Off. | H01L 27/108 |
| 0493614A1 | 7/1992 | European Pat. Off. | H01L 27/115 |
| 0516031A1 | 12/1992 | European Pat. Off. | H01L 27/108 |
| 94110844.1 | 10/1994 | European Pat. Off. | |
| 4107165A1 | 10/1991 | Germany | G11C 11/22 |
| 5190797 | 7/1993 | Japan | H01L 27/108 |

OTHER PUBLICATIONS

"3rd International Syposium on Integrated Ferroelectrics"; ISIF–91; University of Colorado at Colorado Springs; pp. 414–430 (1991).

Wu, et al; "Integr. of Ferroelectric PZT Capacitors with GaAs JFET Devices"; Proceed. of the 3rd Internat'l Symp. on Integ. Ferroelectrics; McDonnell Douglass Elect. Sys. Co.; pp. 390–403 (1991).

Kinney, et al.; "A Non–Volatile Memory Cell Based on Ferroelectric Storage Capacitors"; IEDM; pp. 850–851 (1987).

Wolf; "Silicon Processing for the VLSI Era"; vol. 2; pp. 635–638 (1990).

Jones, et al.; U.S. Appl. No. 08/397,302 filed on Mar. 1, 1995.

*Primary Examiner*—George Fourson
*Assistant Examiner*—H. Jey Tsai
*Attorney, Agent, or Firm*—George R. Meyer

[57] ABSTRACT

A capacitor with a metal-oxide dielectric layer is formed with an upper electrode layer that is electrically connected to an underlying circuit element. The capacitor may be used in forming storage capacitors for DRAM and NVRAM cells. After forming an underlying circuit element, such as a source/drain region of a transistor, a metal-oxide capacitor is formed over the circuit element. An opening is formed through the capacitor and extends to the circuit element. An insulating spacer is formed, and a conductive member is formed that electrically connects the circuit element to the upper electrode layer of the metal-oxide capacitor. Devices including DRAM and NVRAM cells and methods of forming them are disclosed.

10 Claims, 7 Drawing Sheets

PROCESS FOR FORMING A CAPACITOR HAVING A METAL-OXIDE DIELECTRIC

This is a divisional of patent application Ser. No. 08/100,793 filed Aug. 2, 1993, U.S. Pat. No. 5,439,840.

FIELD OF THE INVENTION

The present invention relates to the field of semiconductor devices, and in particular, to semiconductor devices having capacitors.

BACKGROUND OF THE INVENTION

Capacitors are used in many types of semiconductor devices. Within memory devices, such as a dynamic-random-access memory (DRAM) cell or a nonvolatile-random-access memory (NVRAM) cell, the capacitor acts as a storage capacitor. Metal-oxide dielectric layers may be used in storage capacitors for the DRAM or NVRAM cells because the metal-oxide dielectric layers may have a high-permittivity or ferroelectric properties. As used in this specification, high-permittivity means a permittivity higher than the permittivity of silicon dioxide.

A limitation of capacitors with metal-oxide dielectric layers is the ability to integrate the formation of the capacitors into the process flow for semiconductor devices. A specific example using an NVRAM cell illustrates some of the problems. FIG. 1 includes a circuit diagram of an NVRAM cell 1 with a ferroelectric capacitor 2 and a transistor 3. One electrode of the ferroelectric capacitor 2 is coupled to the drive line (DL), and the other electrode is coupled to a source/drain region of the transistor 3. The transistor 3 farther includes another source/drain region coupled to a bit line (BL) and a gate electrode coupled to a word line (WL).

One prior art NVRAM cell includes a "stacked" ferroelectric capacitor. In this NVRAM cell, the transistor is formed in the substrate, a conductive plug is formed to a source/drain region of the transistor, and the ferroelectric capacitor is formed over the conductive plug. An integration problem is the presence of the conductive plug while the ferroelectric capacitor is formed. Many types of conductive plugs include silicon or a metal-containing material. A metal-oxide layer that forms the dielectric layer for the ferroelectric capacitor typically must be oxidized at a temperature higher than about 500 degrees Celsius in order for the metal-oxide layer to have ferroelectric properties. As used in this specification, high temperature means a temperature higher than about 500 degrees Celsius. The conductive plug may not be able to withstand such a processing step. For example, the plug may oxidize to form a region of poor conductivity, thus degrading, or even eliminating, the electrical path between the electrode and the source/drain region of the underlying transistor. As a further example, metal from a metal-containing material may diffuse into the substrate. The material of the conductive plug may either form a junction spike or a silicide material that extends completely through the source/drain region causing and electrical short between one of the electrodes of the ferroelectric capacitor and the substrate or a well region. The use of barrier layers should not help because most barrier layers cannot withstand processing higher than about 500 degrees Celsius.

In one NVRAM cell, a metal strap may be formed between an electrode of the ferroelectric layer and a source/drain region after the ferroelectric capacitor has been formed. FIG. 2 includes a plan view of a "strapped" NVRAM cell 90 that includes a transistor 93 and a ferroelectric capacitor 95. A metal conductor 91 acts as a bit line for the NVRAM cell 90 and is electrically connected to a first doped region 931 that acts as a source/drain region by a contact 911. Conductive member 92 acts as a gate electrode for transistor 93 and is part of the word line. A second doped region 932 acts as the other source/drain region for the transistor 93 and lies on the other side of the conductive member 92. The active region of transistor 93 is defined by field isolation region 98.

A first dielectric layer (not shown) is formed after the transistor 93 is formed and before forming the ferroelectric capacitor 95. Most of the ferroelectric capacitor 95 is typically formed over the field isolation region 98. The ferroelectric capacitor 95 includes a lower electrode layer 96 that acts as a drive line, a metal-oxide dielectric layer (not shown) that acts as the ferroelectric dielectric, and an upper electrode layer 97. A second insulating layer (not shown) is formed over the cell 90. Conductive member 94 electrically connects the upper electrode layer 97 of the ferroelectric capacitor 95 with the second doped region 932. Dashed lines that appear in metal conductor 91 and conductive member 94 show where some of the underlying elements of the cell lie below the metal conductor 91 or the conductive member 94. At least one insulating layer lies between the metal conductor 91 or conductive member 94 and those underlying elements indicated by dashed lines. It should be noted that contacts 941, 942, and 911 are typically formed during the same processing steps and that the contacts extend at least through the second insulating layer. It is further noted that the conductive members 91 and 94 are typically formed during the same processing steps, too.

NVRAM cell 90 is very large. The cell size is limited by how close the conductive members 91 and 94 may be placed to each other and/or how close contacts 941, 942, and 911 may be placed to one another. Further, the cell size is kept large because the orientation of the bit lines across the array typically are generally perpendicular to conductive member 92 that acts as the word line. Thus, the length of the conductive member 91 that acts as the bit line for the cell is generally parallel with the conductive member 94 that acts as an electrical strap. Essentially, the transistor and ferroelectric capacitor are formed side by side from a plan view. The ferroelectric capacitor overlies little, if any, of the transistor because enough tolerance must be given, so that contact 942 contacts doped region 932 and does not contact the lower or upper electrode layer 96 of the ferroelectric capacitor 95.

Similar problems occur with other NVRAM cells, such as those shown in FIGS. 3 and 4. FIG. 3 is a circuit diagram of an NVRAM cell 30 that includes two transistors 31 and 33 and two ferroelectric capacitors 32 and 34. One difference between NVRAM cell 30 and NVRAM cell 1 is the use of complementary bit lines (BL and $\overline{BL}$) as opposed to a single bit line (BL). FIG. 4 includes a circuit diagram of NVRAM cell 40 that includes two p-channel transistors 47 and 44, two n-channel transistors 42 and 45, and two ferroelectric capacitors 43 and 46. A difference between this cell and NVRAM cell 1 is the use of complementary bit lines (BL and $\overline{BL}$) and complementary word lines (WL and $\overline{WL}$). Stacked ferroelectric capacitors used in NVRAM cells 30 and 40 would have process integration problems, and strapped cells would occupy too much substrate area.

FIG. 5 includes a circuit diagram of a DRAM cell 50. Circuit diagrams for a DRAM cell 50 and NVRAM cell 90 are similar. The DRAM cell 50 includes a transistor 55 and a storage capacitor 56. A bit line (BL) is coupled to a source/drain region of transistor 55. Transistor 55 further includes a gate electrode that is coupled to a word line (WL) and another source/drain region that is coupled to one of the electrodes of the capacitor 56. The other electrode of the capacitor 56 is coupled to a constant voltage source $V_C$. $V_C$ for the cell 50 may be $V_{SS}$ or half the potential of $V_{DD}$.

Smaller design rules may limit the amount of capacitance that can be stored by the storage capacitor of the DRAM cell. One way to increase the capacitance of the storage capacitor without increasing thicknesses or dimensions is the use of a high-permittivity dielectric material, such as a metal-oxide dielectric material. Unfortunately, a storage capacitor with metal-oxide dielectric layer suffers from integration problems similar to the NVRAM cell. Many of the integration problems of metal-oxide dielectric layers are not seen with a conventional silicon-containing dielectric material, such as silicon dioxide and silicon nitride.

SUMMARY OF THE INVENTION

The present invention includes a semiconductor device comprising a circuit element, a capacitor, and a conductive member. The capacitor overlies the circuit element and includes a first electrode layer, a metal-oxide dielectric layer that overlies the first electrode, and a second electrode layer that overlies the dielectric layer. The conductive member electrically connects the circuit element and the second electrode layer to each other and is configured such that the conductive member extends through the first electrode and dielectric layers of the capacitor. The present invention further include a method of making the device.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF EMBODIMENTS

The present invention includes a metal-oxide capacitor having an electrode layer that is electrically connected to an underlying circuit element by a conductive member that extends through the capacitor itself. The invention may be particularly useful for making high-permittivity or ferroelectric capacitors in DRAMs or NVRAMs. Embodiments of the present invention are described in more detail below. The present invention is not limited to the embodiments described.

Metal-Oxide Capacitor

Figure 6:
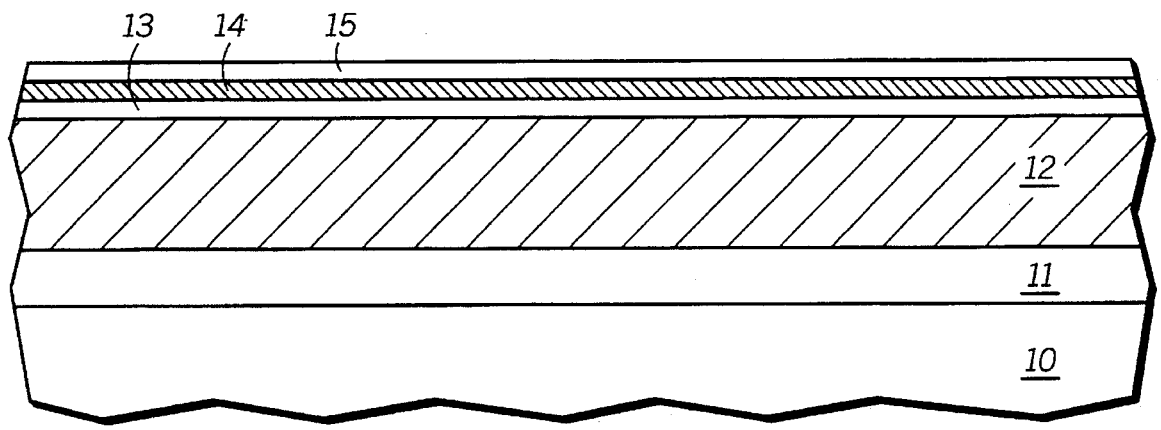
FIGS. 6–12 include cross-sectional views of a portion of a semiconductor substrate illustrating the formation of a metal-oxide capacitor that is electrically connected to an underlying circuit element in accordance with an embodiment of the present invention.

FIG. 6 includes a cross-sectional view of a portion of semiconductor substrate 10 with layers formed over it. Circuit element 11 overlies the substrate 10. Circuit element 11 could be one of a variety of items including a doped region within the substrate 10 or a conductive member, such as a gate electrode, a capacitor electrode, a contact or via plug, an interconnect, and the like, lying over the substrate 10. The circuit element 11 is anything that is to be electrically connected to a high-permittivity metal-oxide capacitor to be formed. Substrate 10 may be a semiconductor or insulating material. Insulating layer 12, lower electrode layer 13, metal-oxide dielectric layer 14, and upper electrode layer 15 are sequentially formed over the circuit element 11.

The selection of materials for each of the layers above the circuit element 11 depends on the device that is formed and other layers that a particular layer currently or subsequently contacts. For example, a DRAM requires a high-permittivity capacitor, but the metal-oxide dielectric layer 14 does not need to have ferroelectric properties. The metal-oxide layer may include tantalum pentoxide ($Ta_2O_5$), a zirconate titanate ($Zr_xTi_yO_z$), strontium titanate ($SrTiO_3$), barium strontium titanate (BST), lead zirconate titanate (PZT), lanthanum-doped PZT, or the like. Those skilled in the art appreciate that lead zirconium titanate and lead zirconate titanate are the same material, although this same material has two different names. With an NVRAM, the metal-oxide dielectric layer 14 must have ferroelectric properties, and therefore, may include bismuth titanate ($Bi_4Ti_3O_{12}$), barium titanate ($BaTiO_3$), BST, PZT, lanthanum-doped PZT, or the like.

Selection of materials for the electrode layers 13 and 15 depend in part on the material used for the dielectric layer 14. Lead reacts with or diffuses into many silicon-containing compounds. Electrode layers 13 and 15 should not include silicon-containing compounds or allow lead diffusion if 1) the metal-oxide dielectric layer includes lead and 2) the dielectric layer 14 is exposed to a temperature higher than about 500 degrees Celsius. If lead is present, the electrode layers 13 and 15 may include ruthenium, rhenium, iridium, osmium, any of the conductive metal oxides of the previous four elements, platinum, or the like. If the metal-oxide dielectric layer includes $Ta_2O_5$, the electrode layers 13 and 15 may include virtually any conductive material including doped silicon, metals, and metal-containing compounds. The insulating layer 12 may include any conventional semiconductor insulating material, such as silicon dioxide, silicon nitride, or the like. The insulating layer 12 includes a silicon dioxide layer and a thin top layer of titanium dioxide. In other embodiments, the thin top may not be needed or may be replaced by or used in conjunction with tantalum pentoxide, magnesium oxide, or the like, especially if the metal-oxide dielectric layer 14 includes lead and there is a possibility that the metal-oxide layer 14 may come in contact with the insulating layer 12 during high temperature processing. Also, a thin titanium layer may be formed prior to forming the lower electrode layer 13 if the insulating layer does not include the thin titanium dioxide layer. The titanium layer would act as an adhesion layer between the insulating layer 12 and the lower electrode layer 13. Needless to say, the selection of materials for layers 12–25 depends on the type of device and the layers that will come in contact with any specific layer.

For simplicity, it is assumed that a ferroelectric capacitor is to be formed. Specific materials will be named to aid in understanding the present invention. The present invention is not limited to those specific materials. Referring to FIG. 6, the insulating layer 12 is silicon dioxide and the lower electrode 13 is platinum. The metal-oxide dielectric layer 14 is PZT and is deposited using a conventional method, such as sputter depositing, sol-gel coating, or chemical vapor deposition. The metal-oxide dielectric layer 14 is annealed in an oxidizing ambient at a temperature between about 650–700 degrees Celsius. The annealing time is typically between about 10–300 seconds for a rapid thermal processor and between about 5–30 minutes for a conventional furnace. The oxidizing ambient includes oxygen and may include a gas diluent, such as nitrogen, helium, argon, and the like. Depending on the material and deposition method used for the metal-oxide layer 14 and the annealing time of the layer 14, the annealing temperature may be between about 500–800 degrees Celsius. After annealing, the upper electrode 15 is formed and made of platinum.

The electrode layers 13 and 15 and metal-oxide layer 14 are patterned using conventional methods. In this embodiment, platinum may be wet etched or dry etched. Wet etching may be performed using an aqua regia solution or a modified aqua regia solution. The latter is an aqueous solution including hydrochloric (HCl) and nitric ($HNO_3$) acids and an etching solution at about 75 degrees Celsius. The etching solution includes 60–80 weight percent phosphoric acid $H_3PO_4$, 10–25 weight percent acetic acid ($CH_3COOH$), 0.1–5 weight percent $HNO_3$, and the remainder water. This etching solution is commercially available from Olin Hunt Specialty Products, Inc. and is called M2S™. Dry etching may be performed using a method, such as ion milling. The metal-oxide dielectric layer 14 may be patterned using wet or dry etching techniques. Wet etching may be performed with a solution including hydrofluoric acid, nitric acid, and hydrogen peroxide. The solution is maintained at about room temperature during the etch. Dry etching may be performed using plasma etching or ion milling. For plasma etching, the etching chemistry should include oxygen, fluorine-containing compounds, such as carbon tetrafluoride ($CF_4$) and the like, or chlorine-containing compounds, such as carbon tetrachloride ($CCl_4$), molecular chlorine ($Cl_2$), and the like.

Figure 7:
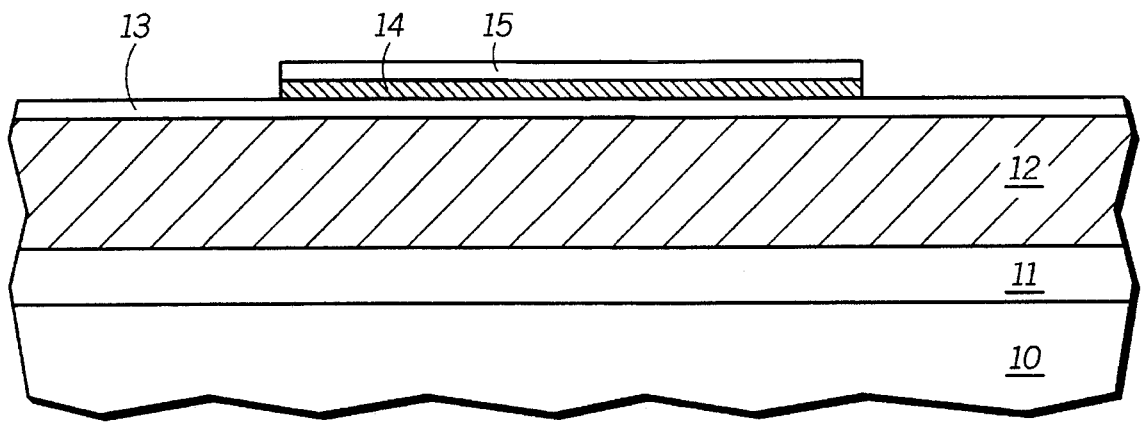
Figure 8:
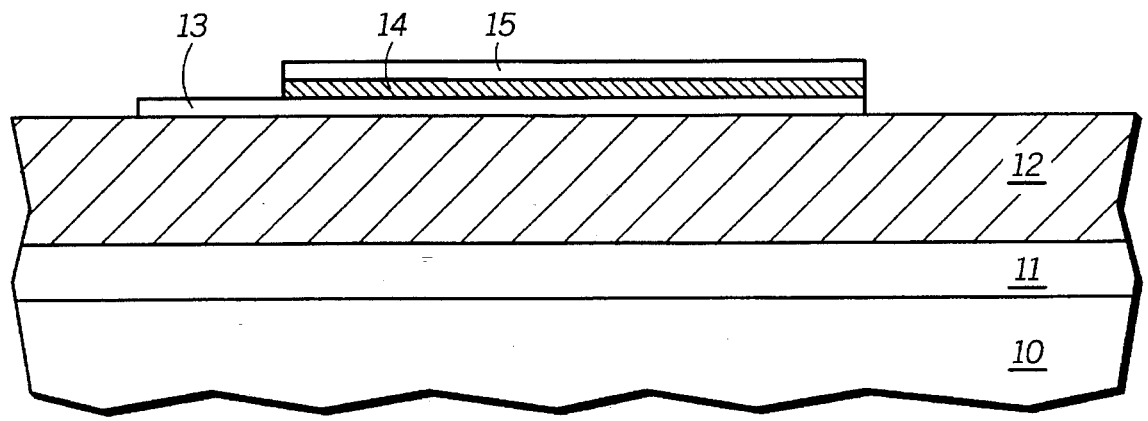

In this embodiment, a first masking layer (not shown) is formed over the upper electrode layer 15. The upper electrode layer 15 and the metal-oxide dielectric layer 14 are patterned using ion milling such that the edges of the two layers are substantially coincident with each other to form the patterned layers. After the ion milling step, the first masking layer is removed. The patterned metal-oxide and upper electrode layers 14 and 15 are shown in FIG. 7. Some of the lower electrode layer 13 may be etched during the ion milling but is not shown in FIG. 7. A second masking layer (not shown) is formed over the electrode layers 13 and 15. The lower electrode layer 13 is patterned by any of the wet or dry etching techniques used for platinum. After the lower electrode layer 13 is patterned, the second masking layer is removed. FIG. 8 shows the device at this point in the process. The portion of the lower electrode layer 13 that extends beyond layers 14 and 15 allows a subsequently formed contact to reach the lower electrode layer 13.

Figure 9:
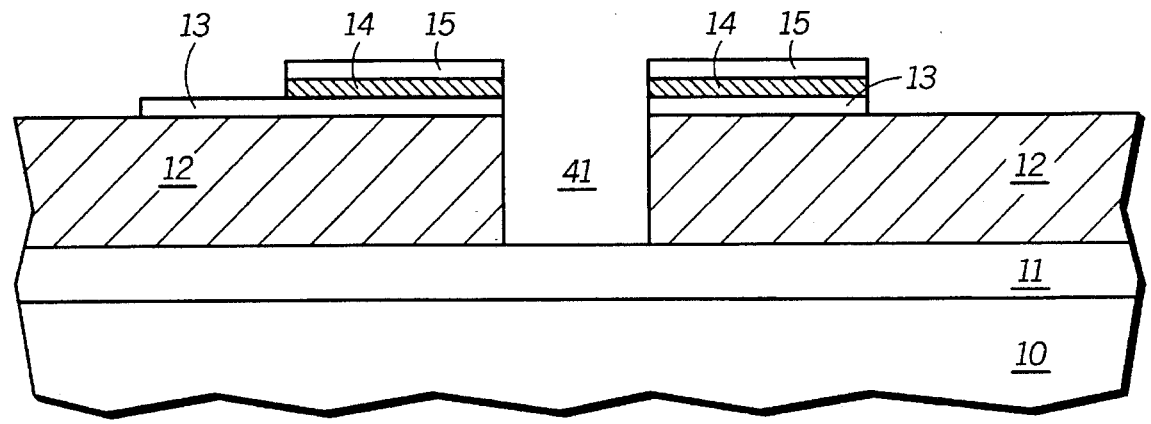

An opening 41 is formed that extends through layers 12–15 to the circuit element 11 as shown in FIG. 9. A third masking layer (not shown) in formed over the upper electrode layer 15 where the opening 41 to the circuit element 11 is to be formed. The opening 41 may be formed by ion milling through the layers 13–15 and then plasma etching the insulating layer 12. The ion milling allows layers 13–15 to be patterned while keeping the edges of the layers adjacent to the opening substantially coincident with one another. The ion milling may extend partially into the insulating layer 12. The plasma etch of the insulating layer usually provides an etch that is more selective with respect to circuit element 11 than can be achieved with ion milling. Also, the plasma etching does not usually erode the third masking layer as fast as ion milling. The opening 41 may be formed completely by ion milling if the third masking layer is thick enough to account for the ion milling of layers 12–15. Other conventional etching methods may be used to form the opening 41, such as wet etching or other dry etching techniques. After opening 41 is formed, the third masking layer is removed.

Figure 10:
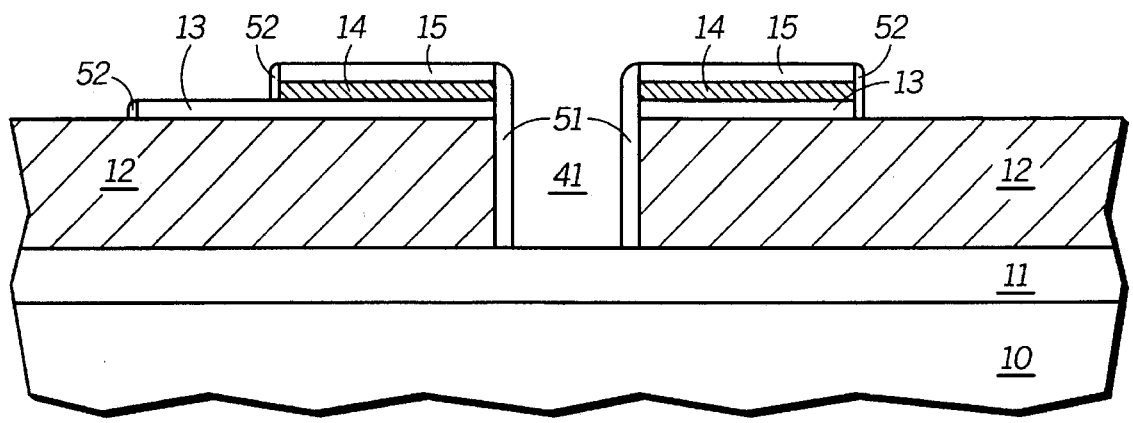

Insulating spacers 51 and 52 are formed along exposed edges of layers 12–15 as shown in FIG. 10. The selection of the material for the insulating spacer 51 depends on the material used for the metal-oxide dielectric layer 14 and temperature cycles to which the insulating spacer 51 is subsequently subjected. In this embodiment, the metal oxide layer 14 includes lead (from the PZT) that may react with silicon-containing insulating materials if the device is exposed to a temperature higher than about 500 degrees Celsius. Therefore, the insulating spacer 51 may include titanium dioxide ($TiO_2$), tantalum pentoxide ($Ta_2O_5$), magnesium oxide (MgO), or the like.

One method of forming the spacers 51 and 52 may be to: 1) deposit titanium and thermally oxidize it to form titanium dioxide, and 2) anisotropically etching the titanium dioxide using a fluorine-containing plasma. Alternatively, the spacers 51 and 52 may be formed by depositing $TiO_2$ or $Ta_2O_5$ by reactive sputtering or chemical vapor deposition followed by an anisotropic etch. If the metal-oxide dielectric layer does not contain lead or is not exposed to a temperature higher than about 500 degrees Celsius, silicon-containing materials may be used in spacers 51 and 52. Needless to say, many different materials and deposition and etching methods may be used. In general, the deposition of the material used for the insulating spacers 51 and 52 should be conformal, although this is not a requirement. The insulating material for the insulating spacers 51 and 52 is deposited to a thickness between about 100–3000 angstroms thick. At least some of the insulating material should be deposited along the exposed side edges of layers 13 and 14. The etching to form the spacers 51 and 52 should be primarily anisotropic. The etching may include some isotropic etching, but once again, at least some of the insulating spacer 51 must lie adjacent to the layers 13 and 14. When the insulating spacer 51 formation is completed, the spacers 51 must be thick enough to prevent an electrical connection between a subsequently formed conductive member that is formed within the opening 41 and either the lower electrode layer 13 or the metal-oxide dielectric layer 14.

Figure 11:
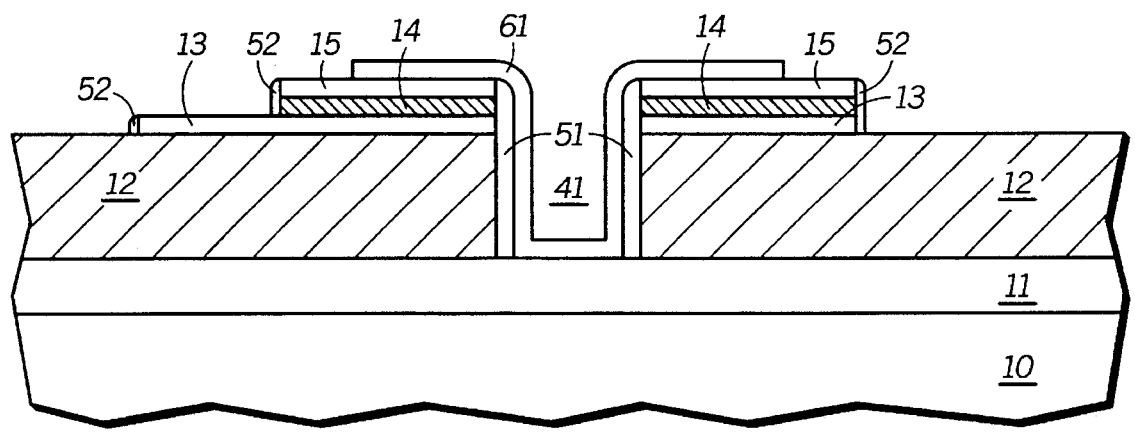

A conductive member 61 is formed that electrically connects the circuit element 11 to the upper electrode layer 15 as shown in FIG. 11. The conductive member 61 may include silicon, a metal, or a metal-containing compound. In general, a conductive layer is deposited by a conventional method, such as chemical vapor deposition, sputter deposition, and the like. A fourth masking layer (not shown) is formed over the conductive layer where the conductive member 61 is to be formed. The exposed portions of the conductive layer are etched leaving conductive member 61. The fourth masking layer is removed after the conductive member 61 has been formed. Polysilicon, tungsten, or titanium nitride may be conformally formed and patterned to form the conductive member 61. Alternatively, any conductive material that can be deposited and patterned while leaving at least some conductive material along the side of the insulating spacer 51 may be used.

The conductive member may include more than one part. For example, a conductive plug including tungsten, polysilicon, or the like, may be formed that partially or completely fills the opening 41. A local interconnect may be formed that contacts the conductive plug and the upper electrode layer 15. In this case, the combination of the conductive plug and the local interconnect forms the conductive member 61.

Figure 12:
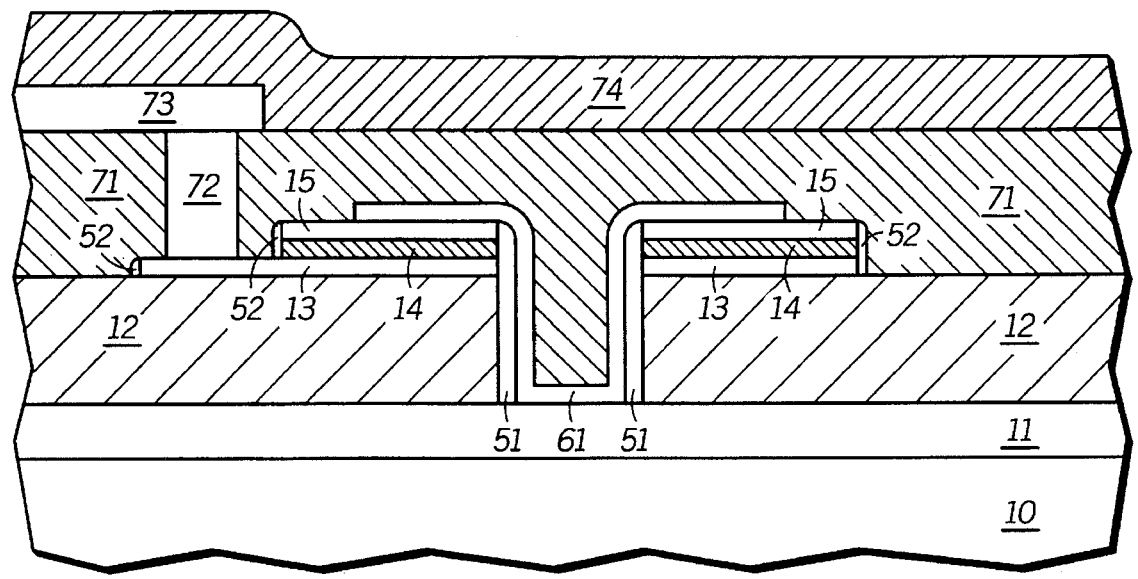

A substantially completed device is shown in FIG. 12. A second insulating layer 71 is formed over the substrate 10 including the conductive member 61. An opening and a conductive plug 72 are sequentially formed within the second insulating layer 71 that makes electrical connection to the lower electrode layer 13. An interconnect 73 and a passivation layer 74 are formed. Other layers and electrical connections (not shown) may be formed if needed.

Many benefits are seen with this embodiment. The capacitor and connection to the circuit element do not have the prior art strap that occupies valuable substrate area. The conductive member 61 is formed after most of the high temperature processing is completed. In a prior art stacked capacitor, the conductive member between a circuit element and the lower electrode is formed prior to annealing its metal-oxide dielectric layer. The conductive member of the prior art stacked capacitor may have adverse interactions, such as reactions, deformation, melting, diffusion, and the like, with adjacent layers or the oxidizing ambient during the anneal. In the embodiment of the present invention that is described above, the conductive member 61 is formed after the annealing step of the metal-oxide dielectric layer 14. Therefore, the conductive member 61 should not have any adverse interactions with adjacent layers or the oxidizing ambient during the anneal. If the conductive member 61 is a conductive metal oxide or metal that can form a conductive metal oxide, the device may be subjected to an oxidizing ambient after conductive member 61 is formed. Another benefit is the simplicity of formation of the device. Process integration issues are not expected to be difficult.

A complete list of all possible options of forming the metal-oxide dielectric capacitor would be difficult to compile. Many options have already been addressed previously. The patterning of layers 13–15 prior to forming any portion of the opening 41 may take many forms. Each of layers 13–15 may be patterned separately, layer 14 may be patterned with layer 13 or layer 15, or the three layers may be patterned during one step. Also, the patterning of the layers 13–15 outside of the opening 41 may be performed after the conductive member 61 is formed. The insulating layer that forms the insulating spacers 51 and 52 may be formed using many different methods. That insulating layer may be chemically deposited or sputter deposited (reactively or otherwise). As described in the embodiment, the insulating layer for the insulating spacers 51 and 52 may be formed by depositing a material and subsequently oxidizing it to form an insulating layer. The oxidation to form the insulating spacers may be performed after the spacers are formed. In this case, circuit element 11 must be able to withstand a thermal oxidation cycle without forming an insulating layer between the circuit element 11 and the subsequently formed conductive member 61. If the spacer material is oxidized to form spacers 51 and 52 after the circuit element 11 is exposed, circuit element 11 should not form an insulator. Although specific thicknesses have been given, other thicknesses may be used without departing from the spirit or scope of the present invention. The options listed herein are meant to be illustrative and not limiting.

NVRAM Cells

Figure 13:
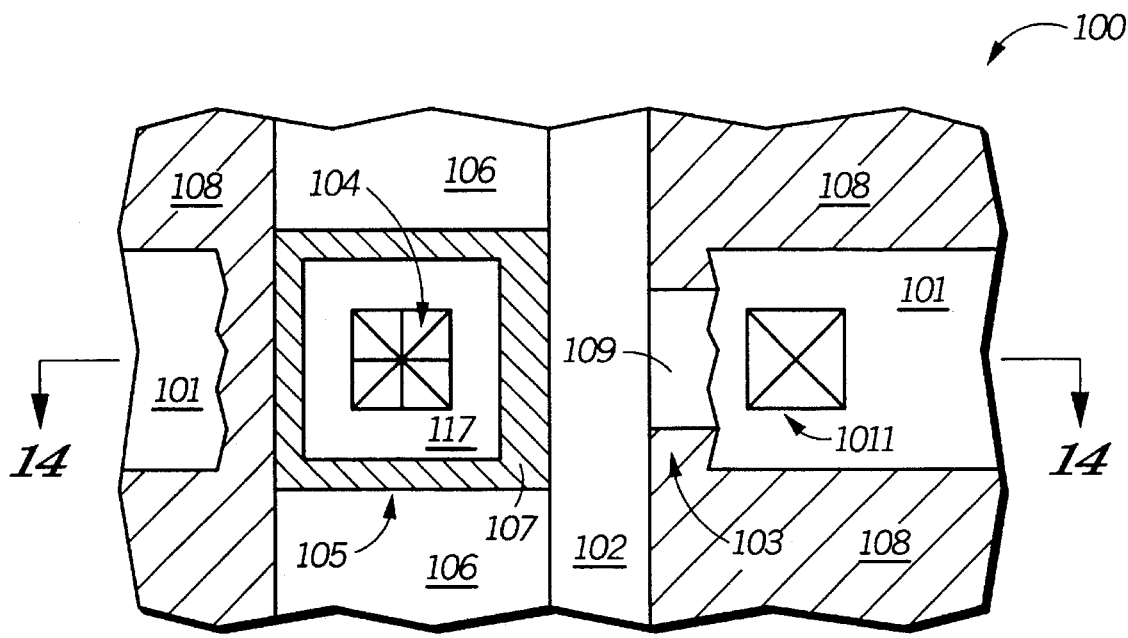
FIGS. 13 and 14 include a plan view and a cross sectional view, respectively, of an NVRAM cell having one transistor and one ferroelectric capacitor formed in accordance with an embodiment of the present invention.
Figure 14:
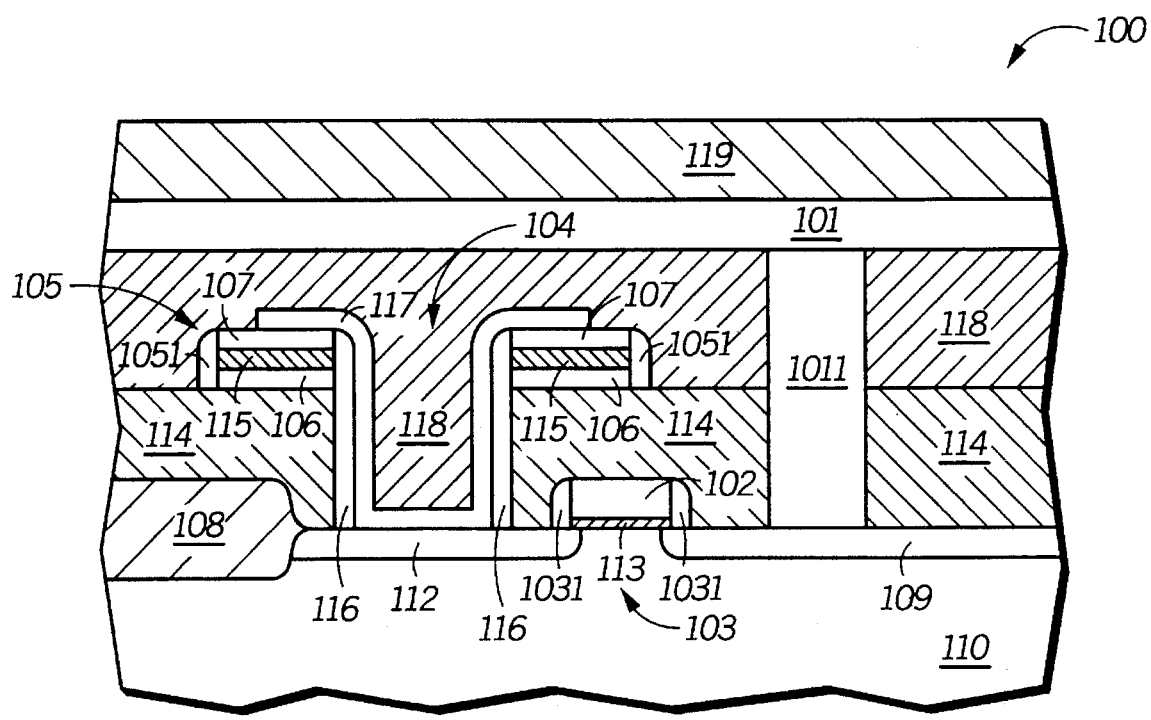

The present invention is particularly useful in conjunction with an NVRAM cell. FIGS. 13 and 14 include an NVRAM cell 100 having a transistor 103 and a ferroelectric capacitor 105. FIG. 13 is a plan view of the NVRAM cell 100, and FIG. 14 is a cross-sectional view of the NVRAM cell 100. Interconnect 101 acts as a bit line and has a length that generally extends between the left-hand side and the right-hand side of FIG. 13. A portion of interconnect 101 is not shown in FIG. 13 to more clearly show the underlying elements of the NVRAM cell 100. A conductive plug 1011 electrically connects the interconnect 101 to a first doped region 109 that acts as a source/drain region of transistor 103. Transistor 103 further includes a conductive member 102 that acts as a word line for the NVRAM cell 100 and a second doped region (not shown in FIG. 13) that acts as the other source/drain region for transistor 103 and underlies the ferroelectric capacitor 105. The ferroelectric capacitor 105 includes a lower electrode layer 106 that acts as the drive line for the NVRAM cell 100, a metal-oxide dielectric layer (not shown in FIG. 13) that acts as the ferroelectric dielectric, and an upper electrode layer 107. Conductive member 117 electrically connects the upper electrode layer 107 to the second doped region of transistor 103 via opening 104. A conductive member 117 is not electrically connected to either the lower electrode layer 106 or the metal-oxide dielectric layer of the ferroelectric capacitor 105. FIG. 13 includes field isolation region 108 that defines the active area of the transistor 103.

FIG. 14 includes a cross-sectional illustration of a portion of the NVRAM cell 100 as indicated in FIG. 13. The cross-sectional description generally follows the order in which the elements of the cell are formed. The NVRAM cell 100 is formed on a region 110. The region 110 may be a p-well region in an n-type substrate (not shown) or a p-type region that has a higher doping concentration that a p-type substrate (not shown) in which the p-type region lies. Field isolation region 108 is formed using a conventional field isolation process sequence, such as a local oxidation of silicon (LOCOS) process. A gate dielectric layer 113 and a conductive member 102 are formed. The gate dielectric layer may be formed by thermal oxidation or by chemical vapor deposition. A conductive layer is formed by depositing a layer that is conductive or can be made conductive by doping it, such as polysilicon, amorphous silicon and the like. The gate dielectric and conductive layers are patterned to form the gate structure shown in FIG. 14 including gate dielectric layer 113 and conductive member 102. After forming the gate structure the doped regions 109 and 112 are formed within the semiconductor substrate 110 by 1) lightly doping the exposed portions of the substrate with an n-type dopant, 2) forming sidewall spacers 1031 adjacent to the gate structure, and 3) heavily doping the exposed portions of the substrate with an n-type dopant. At this point in the process, transistor 103 has been formed and includes the doped regions 109 and 112, the gate dielectric layer 113, the conductive member 102, and a channel region. The channel region is the portion of the substrate that lies between the doped regions 109 and 112 and immediately beneath the gate dielectric layer 113.

The next portion of the process sequence is used to form the ferroelectric capacitor 105. A first insulating layer 114 is formed over the substrate 110 and the transistor 103. Lower electrode layer 106, metal-oxide layer 115, and upper electrode layer 107 are formed and patterned using an embodiment described in conjunction with forming and patterning layers 13–15 that was described in the section entitled "Metal-Oxide Capacitor" relating to a ferroelectric capacitor. The ferroelectric capacitor 105 requires that the metal-oxide layer 115 act as a ferroelectric dielectric. Therefore, the metal-oxide layer 115 may include BST, PZT, lanthanum-doped PZT, or the like. Also, the lower electrode layer 106 acts as the drive line for the NVRAM cell 100. The lower electrode layer 106 must be patterned separately from the upper electrode layer 107. The metal-oxide layer 115 may be patterned during the same patterning step as either electrode layer 106 or 107 or may be patterned separately. Otherwise, many of the material options for the electrodes 106 and 107 and processing options available to form the capacitor described in an earlier embodiment may be used in forming the ferroelectric capacitor 105. An anneal with an oxidizing ambient similar to one previously described is performed anytime after the metal-oxide layer 115 is deposited. Also, other anneals may be provided at various points in the process sequence prior to forming the conductive member 117, although this is not required.

The next portion of the process sequence electrically connects the upper electrode layer 107 of the ferroelectric capacitor 105 with the second doped region 112 of the transistor 103. An opening 104 is formed through layers 107, 115, 106, and 114 to the second doped region 112. Insulating spacer 116 is formed within opening 104, and insulating spacers 1051 are formed adjacent to layers 107, 115, and 106 in locations outside the opening 104. If the insulating spacers 116 and 1051 are exposed to a temperature higher about 500 degrees Celsius, the insulating spacers should not include silicon-containing compounds. The insulating spacers 116 and 1051 may include titanium dioxide, tantalum pentoxide, magnesium oxide, or the like. If the insulating spacers 116 and 1051 are not exposed to a temperatures higher than about 500 degrees Celsius, the insulating spacers may include silicon-containing compounds, such as silicon dioxide, silicon nitride, and the like. After forming the insulating spacers 116 and 1051, a conductive member 117 is formed. The materials and processing options discussed with respect to forming opening 41, insulating spacers 51 and 52, and conductive member 61 in the section entitled "Metal-Oxide Capacitor" apply to corresponding elements of opening 104, insulating spacers 116 and 1051, and conductive member 117 to the extent those options are not contrary to concerns discussed within this paragraph.

A second insulating layer 118 is formed over the conductive member 117 and the first insulating layer 114. A contact opening is formed that extends through the first and second insulating layers 114 and 118 to the first doped region 109. Conductive plug 1011 fills the contact opening. Interconnect 101 is formed over the conductive plug 1011. A passivation layer 119 is formed over the device including the interconnect 101 to form a substantially completed device. Interconnect 101 extends across the entire length of the NVRAM cell 100 and is illustrated as such in FIG. 14. Other layers and electrical connections (not shown) may be formed if needed.

The NVRAM cell 100 has many benefits compared to the prior art NVRAM cell 90. The interconnects 91 and 94 cause the cell 90 to be quite large. Minimum spacing requirements are needed at both the contact opening and interconnect levels to assure a reliable process. The cell size is not typically limited by the capacitor area, so that a large capacitor area may be used even if the large capacitor area is not required. Therefore, the cell 90 may occupy an area of about 840 square microns and have a capacitor area of about 200 square microns for a four micron minimum feature size. Unlike the prior art cell, NVRAM cell 100 has a cell area that is determined more by the capacitor area as opposed to the contact or interconnect spacing concerns. Using similar design rules as the prior art cell, NVRAM cell 100 occupies an area of about 320 square microns and has a capacitor area of about 110 square microns. Although the NVRAM cell 100 is about three times smaller than the prior art cell 90, an NVRAM cell of the present invention should be at least twice as small as a prior art strapped cell when using similar design rules.

The present invention also has advantages over a stacked capacitor NVRAM cell. A conductive member, which electrically connects a source/drain region of the transistor to the lower electrode layer of the ferroelectric capacitor in a stacked NVRAM cell, is formed prior to the annealing of the metal-oxide dielectric layer 115 to give it ferroelectric properties. The anneal may cause the conductive member to oxidize or have adverse interactions with layers adjacent to that conductive member. The NVRAM cell 100 of the present invention does not form the conductive member between the second doped region 112 of the transistor 103 and the upper electrode layer 107 of the ferroelectric capacitor 105 until after all of the anneals for the metal-oxide layer 115 have been performed. Therefore, no adverse interactions between the conductive member 117 and other portions of the NVRAM cell 100 should occur.

The NVRAM cell 100 is typically one of a plurality of cells within a memory array. The NVRAM cell 100 within the array is typically surrounded by NVRAM cells on all four sides. The cells on the each side has a plan view that is a mirror image of the NVRAM cell 100 as shown in FIG. 13. Interconnect 101 acts as the bit line for NVRAM cell 100 as well as those cells to the left and fight of that cell with respect to FIG. 13.

Many options for formation that were described in the section entitled "Metal-Oxide Capacitor" should be applicable to the NVRAM cell 100. Conductivity types of the semiconductor materials may be reversed.

Figure 1:
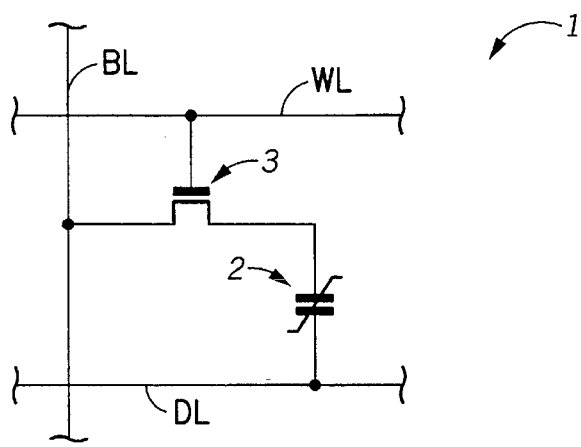
FIG. 1 includes a circuit diagram of an NVRAM cell having one transistor, one ferroelectric capacitor, and a single bit line. (Prior art)
Figure 2:
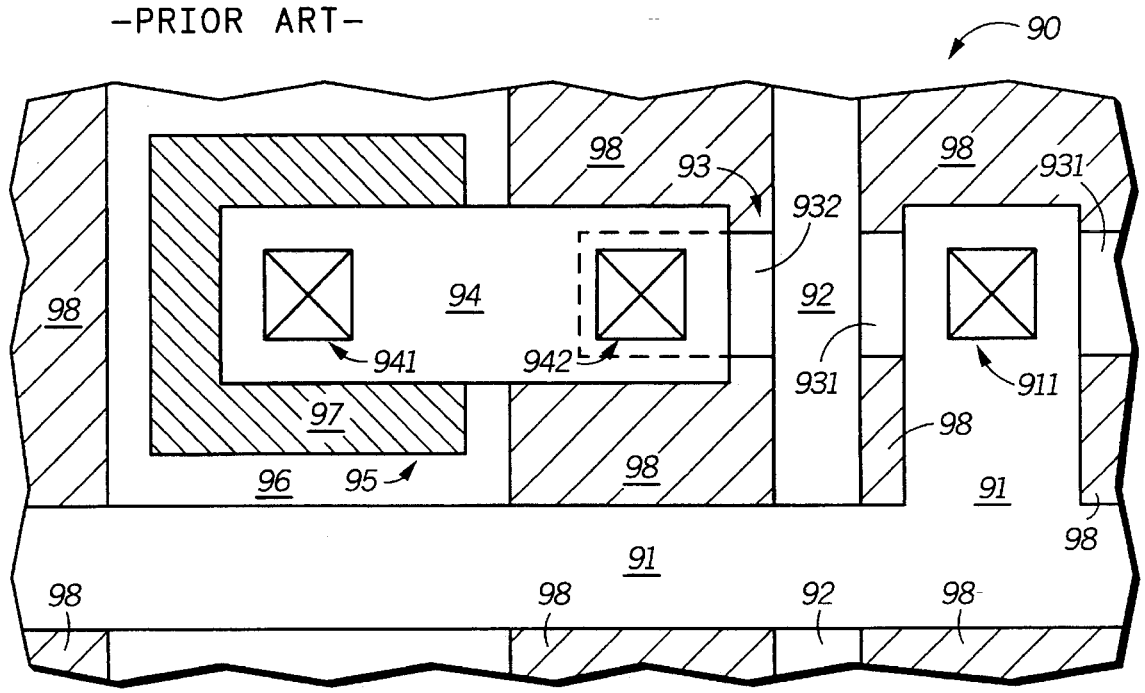
FIG. 2 include a plan view of a strapped NVRAM cell.
Figure 3:
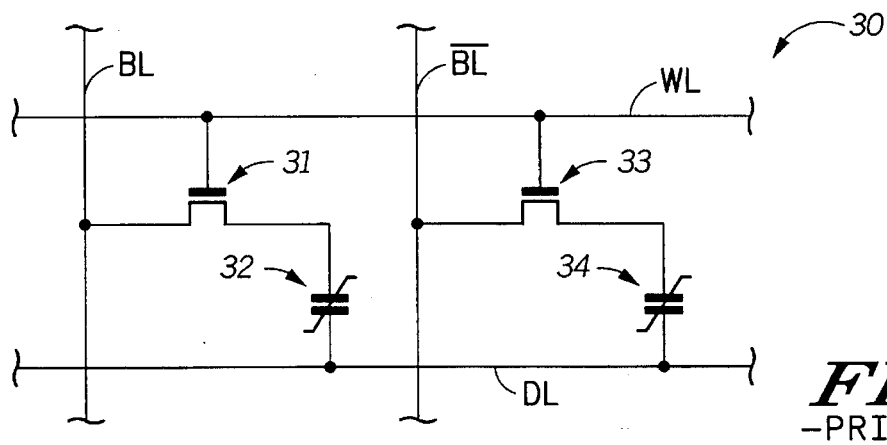
FIG. 3 includes a circuit diagram of an NVRAM cell having two transistors, two ferroelectric capacitors, and complementary bit lines. (Prior art)
Figure 15:
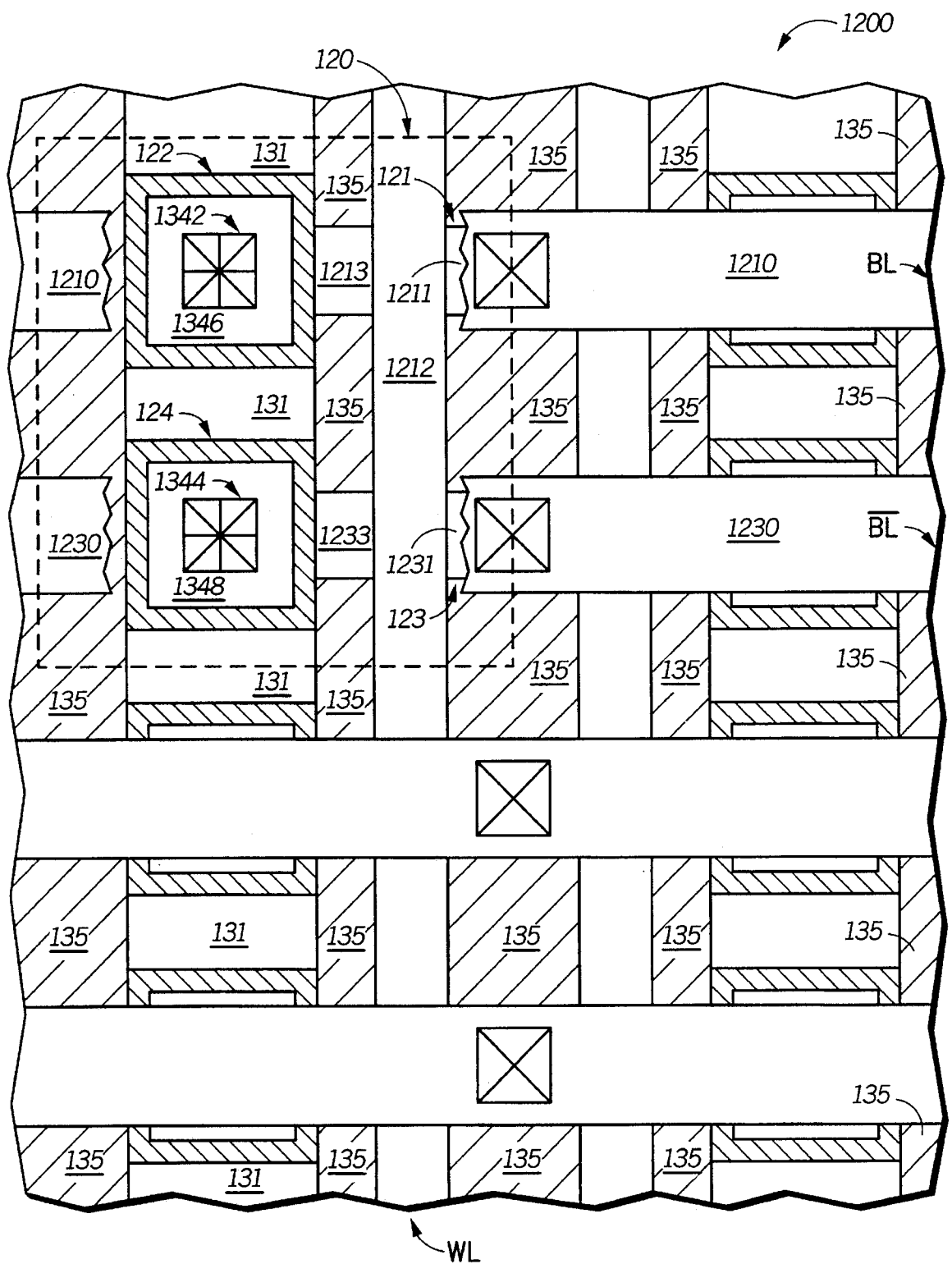
FIG. 15 includes a plan view of an NVRAM cell having two transistors, two ferroelectric capacitors, and complementary bit lines formed in accordance with an embodiment of the present invention.

Other NVRAM cell designs may also use the present invention. FIG. 15 includes a plan view of a portion of an NVRAM memory array 1200 including an NVRAM cell 120 that is shown by dashed lines. The NVRAM cell 120 includes two transistors 121 and 123 and two ferroelectric capacitors 122 and 124 and has a circuit diagram similar to the one shown in FIG. 3. Interconnects 1210 and 1230 act as the complementary bit lines BL and $\overline{BL}$, respectively. Although interconnects 1210 and 1230 extend completely across the length of the NVRAM cell 120, portions of interconnects 1210 and 1230 are not shown in FIG. 15, so that underlying elements can be more clearly seen. Interconnect 1210 is electrically connected to a first doped region 1211 that acts as a source/drain region of transistor 121. Transistor 121 also includes a second doped region 1213 that acts as the other source/drain region for the transistor. Conductive member 1212 acts as the gate electrode for transistor 121. Interconnect 1230 is electrically connected to a third doped region 1231 that acts as a source/drain of transistor 123. Transistor 123 also includes a fourth doped region 1233 that acts as the other source/drain region for the transistor. Conductive member 1212 acts as the gate electrode for transistor 123. Conductive member 1212 also acts as the word line for the NVRAM cell 120. Active regions for transistors 121 and 123 are defined by the field isolation region 135.

Capacitors 122 and 124 include a lower electrode layer 131 and upper electrodes 1340 and 1341. The lower electrode layer 131 acts as the drive line and underlies substantially all of the upper electrodes 1340 and 1341. Opening 1342 extends through the ferroelectric capacitor 122 to the second doped region 1213, and opening 1344 extends through the ferroelectric capacitor 124 to the fourth doped region 1233. Conductive member 1346 extends through the opening 1342 and electrically connects the second doped region 1213 to the upper electrode 1340 for the ferroelectric capacitor 122. Conductive member 1348 extends through the opening 1344 and electrically connects the fourth doped region 1233 to the upper electrode 1341 for the ferroelectric capacitor 124.

Figure 4:
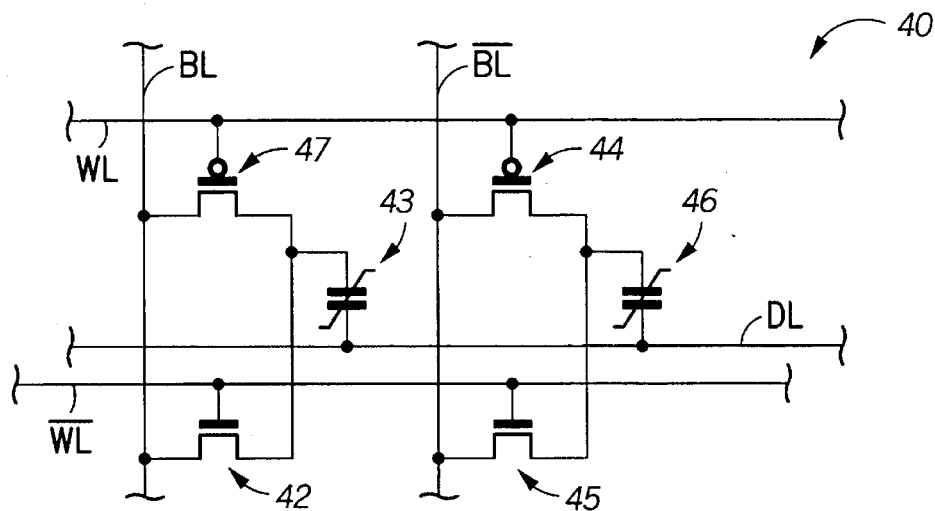
FIG. 4 includes a circuit diagram of an NVRAM cell having four transistors, two ferroelectric capacitors, complementary bit lines, and complementary word lines. (Prior art)
Figure 16:
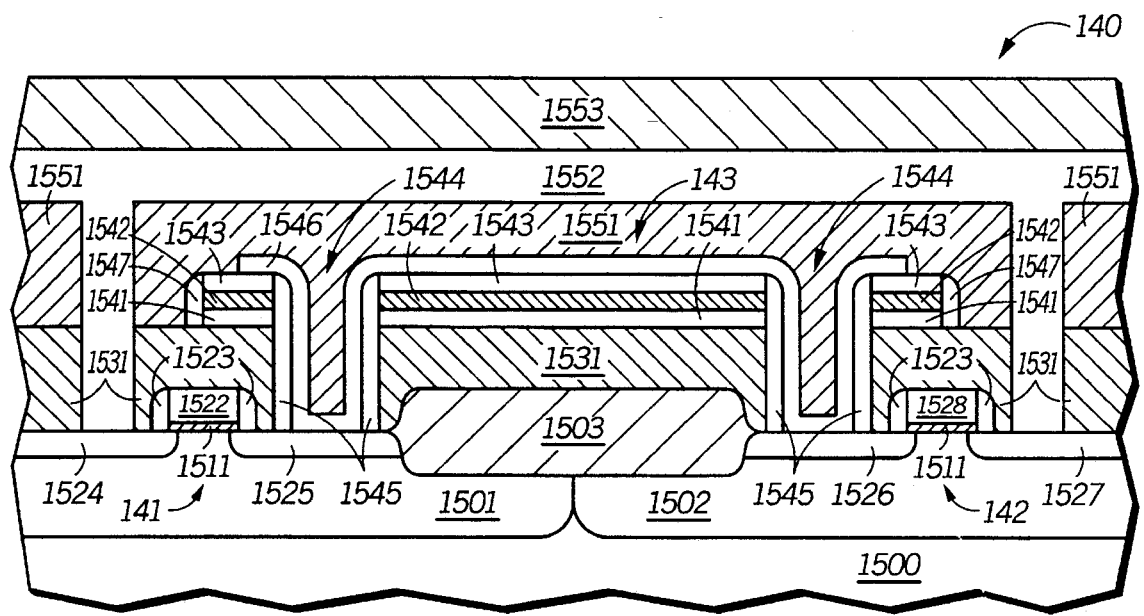
FIG. 16 include a cross-sectional view of an NVRAM cell having four transistors, two ferroelectric capacitors, complementary bit lines, and complementary word lines formed in accordance with an embodiment of the present invention.

FIG. 16 includes an NVRAM cell 140 that has a circuit diagram similar to the one shown in FIG. 4. FIG. 16 includes a cross-sectional view of a portion of the NVRAM cell 140 parallel with the length of one of the bit lines. An n-well 1501 and a p-well 1502 lie within a semiconductor substrate 1500. Field isolation region 1503 separates the transistors 141 and 142 from one another. Transistor 141 includes a gate dielectric layer 1511, conductive member 1522 that acts as a gate electrode, and first and second doped regions 1524 and 1525 that act as the source/drain regions for the transistor. Transistor 142 includes a gate dielectric layer 1511, conductive member 1528 that acts as a gate electrode, and third and fourth doped regions 1526 and 1527 that act as the source/drain regions for the transistor. Gate electrode 1522 acts as one word line (WL) and gate electrode 1528 acts as the complementary word line ($\overline{WL}$). Adjacent to the gate electrodes are spacers 1523 that are formed with the process sequence used in forming the doped regions 1524–1527. First and second doped regions 1524 and 1525 are P+ regions, and third and fourth doped regions 1526 and 1527 are N+ regions. A first insulating layer 1531 is formed over the transistors 141 and 142.

The ferroelectric capacitor 143 is formed over the first insulating layer 1531. The ferroelectric capacitor 143 includes a lower electrode layer 1541 that acts as the drive line for the NVRAM cell 140, a metal-oxide dielectric layer 1542 that acts as the ferroelectric dielectric, and an upper electrode layer 1543. Openings 1544 extend through the upper electrode layer 1543, the metal-oxide dielectric layer 1542, the lower electrode layer 1541, and the first insulating layer 1531 to the second and third doped regions 1525 and 1526. Insulating spacers 1545 are formed within openings 1544, and insulating spacers 1547 are formed adjacent to layers 1541–1543 in locations outside the openings 1544. A conductive member 1546 lies over the upper electrode layer 1543 and adjacent the insulating spacers 1545 within the openings 1544. The conductive member 1546 electrically connects the second and third doped regions 1525 and 1526 and the upper electrode layer 1543 to one another.

A second insulating layer 1551 is formed over the conductive member 1546 and the first insulating layer 1531. Contact openings are formed to expose portions of the first and fourth doped regions 1524 and 1527. An interconnect 1552 is formed over the second insulating layer 1551 and within the contact openings. Interconnect 1552 acts as a bit line (BL) and is electrically connected to first and fourth doped regions 1524 and 1527 of transistors 141 and 142, respectively. A passivation layer 1553 is formed over the interconnect 1552 to form a substantially finished device. Other layers and electrical connections (not shown) may be formed, if needed.

The NVRAM cell 140 includes another p-channel transistor, an n-channel transistor, a ferroelectric capacitor, and a complementary bit line ($\overline{BL}$) but are not shown in FIG. 16. These other components would be oriented similar to those shown in FIG. 16 and would lie generally parallel with the length of the interconnect 1552 and either just in front of or just behind the components shown in FIG. 16. With this orientation, the length of the bit lines are generally parallel with one another, and the length of the drive line is generally perpendicular to the bit lines.

The NVRAM cell 140 is not limited the embodiment shown or described. Many of the options available to the other NVRAM cells previously described are also available to the NVRAM cell 140.

DRAM Cells

Figure 5:
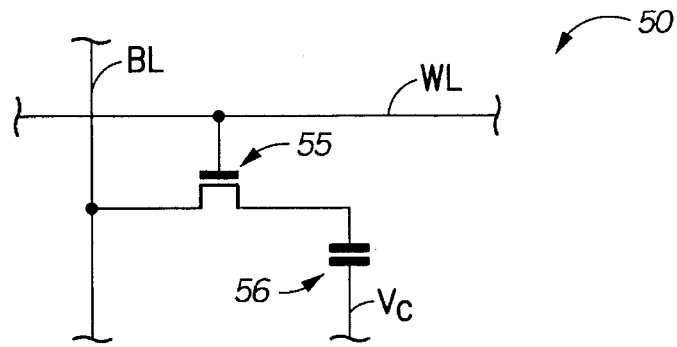
FIG. 5 includes a circuit diagram of a DRAM cell. (Prior art)

The present invention may be used is forming a metal-oxide capacitor in a DRAM cell. FIG. 5 includes a circuit diagram for a DRAM cell. A cross-sectional view of one embodiment of the DRAM cell would visually appear to be nearly identical to NVRAM cell 100 of FIG. 14. It should be kept in mind that the capacitor of the DRAM cell should not have ferroelectric properties over the normal operating temperature range of the DRAM cell. The ferroelectric capacitor 105 is replaced with a high-permittivity capacitor, and the metal-oxide layer is not processed to achieve ferroelectric properties over the normal operating temperature range of the DRAM cell. The metal-oxide dielectric layer may include any of the materials that are listed with those previously described in the high-permittivity capacitor section. Although an anneal may need to be performed to form a high-permittivity metal-oxide dielectric layer, the anneal would not be performed to give the metal-oxide dielectric layer the ferroelectric properties.

The choice of material for the insulating spacer 116 depends on the material used for the metal-oxide dielectric layer and the thermal cycles to which the insulating spacer will be exposed. If the metal-oxide dielectric layer 115 includes lead and the insulating spacer 116 is exposed to a temperature higher than about 500 degrees Celsius, the insulating spacer 116 should be a non-silicon-containing material, such as $TiO_2$, $Ta_2O_5$, MgO, and the like. Otherwise, the insulating spacer may include a silicon-containing material, such as silicon dioxide, silicon nitride, and the like.

In the foregoing specification, the invention has been described with reference to specific embodiments thereof. However, it will be evident that various modifications and changes may be made thereto without departing from the broader spirit or scope of the invention as set forth in the appended claims. Accordingly, the specification and drawings are to be regarded in an illustrative rather than a restrictive sense.

What is claimed is:

1. A process for forming a semiconductor device comprising the steps of:

forming a circuit element;

forming a capacitor overlying the circuit element, wherein:

the capacitor includes a first electrode layer, a metal-oxide dielectric layer that overlies the first electrode layer, and a second electrode layer that overlies the dielectric layer; and forming a conductive member that electrically connects the circuit element and the second electrode layer to each other, wherein the conductive member extends through the first electrode and dielectric layers of the capacitor.

2. The process of claim 1, wherein the metal-oxide dielectric layer includes a material selected from a group consisting of tantalum pentoxide, zirconium titanate, barium titanate, barium strontium titanate, strontium titanate, bismuth titanate, lead zirconate titanate, and lanthanum-doped lead zirconate titanate.

3. The process of claim 1, wherein the circuit element is a source/drain region of a transistor.

4. The process of claim 1, wherein the conductive member includes a material selected from a group consisting of silicon, a refractory metal, and titanium nitride.

5. The process of claim 1, further comprising a step of forming an insulating spacer lying adjacent to the conductive member, the capacitor, and the circuit element, wherein the insulating spacer includes a material selected from a group consisting of a refractory metal oxide and magnesium oxide.

6. A process for forming a random-access memory cell comprising the steps of:

forming a transistor having a source/drain region;

forming a capacitor overlying the source/drain region, wherein:

the capacitor includes a first electrode layer, a metal-oxide dielectric layer that overlies the first electrode layer, and a second electrode layer that overlies the dielectric layer; and forming a conductive member that electrically connects the source/drain region and the second electrode layer to each other, wherein the conductive member extends through the first electrode and dielectric layers of the capacitor.

7. The process of claim 6, wherein:

the memory cell is a dynamic-random-access memory cell; and the metal-oxide dielectric layer includes a material selected from a group consisting of tantalum pentoxide, zirconate titanate, barium strontium titanate, strontium titanate, lead zirconate titanate, and lanthanum-doped lead zirconate titanate.

8. The process of claim 6, wherein:

the memory cell is a nonvolatile-random-access memory cell; and the metal-oxide dielectric layer includes a material selected from a group consisting of barium strontium titanate, barium titanate, bismuth titanate, lead zirconate titanate, and lanthanum-doped lead zirconate titanate.

9. The process of claim 6, wherein the conductive member includes a material selected from a group consisting of silicon, a refractory metal, and titanium nitride.

10. The process of claim 6 further comprising a step of forming an insulating spacer lying adjacent to the conductive member, the capacitor, and the source/drain region, wherein the insulating spacer includes a material selected from a group consisting of a refractory metal oxide and magnesium oxide.

* * * * *

UNITED STATES PATENT AND TRADEMARK OFFICE
CERTIFICATE OF CORRECTION

PATENT NO.    : 5,583,068
DATED         : December 10, 1996
INVENTOR(S)   : Robert E. Jones, Jr. and Papu D. Maniar It is certified that error(s) appear in the above-identified patent and that said Letters Patent are hereby corrected as shown below:

On the Title Page
list only 1st two inventors; Robert E. Jones, Jr. and Papu D. Maniar;
delete 3rd and 4th inventors; Andrew C. Campbell and Reza Moazzami.

Signed and Sealed this

Tenth Day of April, 2001

Attest:

NICHOLAS P. GODICI

Attesting Officer        Acting Director of the United States Patent and Trademark Office